US008017306B2

(12) United States Patent
Tokunaga et al.

(10) Patent No.: US 8,017,306 B2
(45) Date of Patent: Sep. 13, 2011

(54) METHOD FOR PRODUCING CONDUCTIVE FILM

(75) Inventors: Tsukasa Tokunaga, Minami-ashigara (JP); Hiroshi Sakuyama, Minami-ashigara (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 12/696,683

(22) Filed: Jan. 29, 2010

(65) Prior Publication Data

US 2010/0203453 A1 Aug. 12, 2010

(30) Foreign Application Priority Data

Feb. 2, 2009 (JP) ................................ 2009-021821
May 29, 2009 (JP) ................................ 2009-131305

(51) Int. Cl.
*G03F 7/00* (2006.01)
*G03C 5/18* (2006.01)
*H01B 1/02* (2006.01)
*H05K 1/00* (2006.01)
*H05K 9/00* (2006.01)

(52) U.S. Cl. ........ 430/311; 430/314; 430/315; 430/449; 252/514; 174/250; 174/257; 174/388

(58) Field of Classification Search .................. 430/311, 430/314–315, 449; 252/514; 174/250, 257, 174/388
See application file for complete search history.

(56) References Cited

U.S. PATENT DOCUMENTS

2010/0282505 A1* 11/2010 Ichiki et al. .................. 174/388

FOREIGN PATENT DOCUMENTS

| | | |
|---|---|---|
| JP | 05-016281 | 1/1993 |
| JP | 10-163673 | 6/1998 |
| JP | 11-170420 | 6/1999 |
| JP | 2003-318593 | 11/2003 |
| JP | 2004-221564 | 8/2004 |
| JP | 2008-251417 | 10/2008 |
| WO | WO 01/51276 | 7/2001 |

* cited by examiner

*Primary Examiner* — Geraldina Visconti
(74) *Attorney, Agent, or Firm* — Young & Thompson

(57) ABSTRACT

A conductive film producing method includes a metallic silver forming step of exposing and developing a photosensitive material having a 95-μm-thick long support and thereon a silver salt-containing emulsion layer, thereby forming a metallic silver portion to prepare a conductive film precursor, and a smoothing treatment step of subjecting the conductive film precursor to a smoothing treatment to produce a conductive film. In the smoothing treatment, the conductive film precursor is pressed by first and second calender rolls facing each other, and the first calender roll is a resin roll to be brought into contact with the support. The method satisfies the condition of $1/2 \leqq P1/P2 \leqq 1$, wherein P1 represents a conveying force applied when the conductive film precursor is introduced to an area where the smoothing treatment step is conducted, and P2 represents a conveying force applied when the smoothing-treated conductive film is discharged from the area.

11 Claims, No Drawings

METHOD FOR PRODUCING CONDUCTIVE FILM

CROSS-REFERENCE TO RELATED APPLICATION

This application is based upon and claims the benefit of priorities from Patent Application Nos. 2009-021821 and 2009-131305 filed on Feb. 2, 2009 and May 29, 2009, respectively, in the Japan Patent Office, of which the contents are incorporated herein by reference.

BACKGROUND OF THE INVENTION

1. Field of the Invention

The present invention relates to a method for producing a conductive film having an electrically conductive property suitable for use as a light-transmitting electromagnetic-shielding film for various display devices, a transparent electrode for various electronic devices, a transparent planar heating element, etc.

2. Description of the Related Art

Recently, a material having a transparent substrate and a mesh-patterned conductive layer of a thin wire of metal or the like has been known as a conductive film having an electrically conductive property suitable for use as a light-transmitting electromagnetic-shielding film for various display devices, a transparent electrode for various electronic devices, a transparent planar heating element, etc. Known methods for producing the material include the following.

(1) Method including the step's of forming a thin copper layer on a transparent substrate by bonding, electroless plating, etc., and etching the thin copper layer into a pattern by photolithography (see Japanese Laid-Open Patent Publication Nos. 05-016281 and 10-163673, etc.)

(2) Method including the steps of arranging ink containing particles of an electroless plating catalyst such as palladium into a pattern on a transparent substrate by printing, and forming a conductive layer thereon by electroless plating (see Japanese Laid-Open Patent Publication Nos. 11-170420 and 2003-318593, etc.)

(3) Method including the steps of exposing a photosensitive silver halide layer formed on a transparent substrate in a pattern to form a patterned developed silver, and forming a patterned conductive layer thereon by plating (see International Publication No. WO01/51276, Japanese Laid-Open Patent Publication No. 2004-221564, etc.)

Among the above three methods, the method of (3) using the silver halide is advantageous in that it contains simpler processes as compared with the photolithography method, can form a thin wire more easily as compared with the printing method, and is suitable for forming a continuous seamless conductive layer. The surface resistance of the conductive film prepared from such a photosensitive material containing a silver salt (particularly a silver halide) can be sufficiently lowered by a smoothing treatment using a calender roll. Furthermore, the method can easily form a metallic silver portion with a desired pattern and uniform shape advantageously, to improve the conductive film productivity (see Japanese Laid-Open Patent Publication No. 2008-251417, etc.)

In a case where a conductive film precursor prepared from a photosensitive material having a silver salt-containing emulsion layer (particularly a conductive film precursor using a long support having a thickness of 95 μm or more) is subjected to a smoothing treatment using a calender roll, deformation defect caused due to wrinkling must be taken into consideration. Japanese Laid-Open Patent Publication No. 2008-251417 describes a combination of a metal roll and a plastic roll capable of preventing the wrinkling.

However, consideration of not only the combination of the metal and plastic rolls but also a force for conveying the conductive film precursor is required in view of preventing the wrinkling.

SUMMARY OF THE INVENTION

In view of the above problems, an object of the present invention is to provide a method for producing a conductive film using a photosensitive material having a silver salt-containing emulsion layer (particularly a conductive film using a long support having a thickness of 95 μm or more), which is capable of reducing deformation defect caused due to wrinkling in a smoothing treatment using a calender roll, thereby improving the quality and productivity of the conductive film.

[1] A method for producing a conductive film according to the present invention, comprising a metallic silver forming step of exposing and developing a photosensitive material comprising a long support and thereon an emulsion layer containing a silver salt, thereby forming a metallic silver portion to prepare a conductive film precursor, and a smoothing treatment step of subjecting the conductive film precursor to a smoothing, treatment to produce a conductive film, wherein that the support has a thickness of 95 μm or more, the conductive film precursor is pressed by a first calender roll and a second calender roll facing each other in the smoothing treatment, the first calender roll is a resin roll and is brought into contact with the support, and the method satisfies the condition of $$1/2 \leqq P1/P2 \leqq 1$$

wherein P1 represents a conveying force applied when the conductive film precursor is introduced to an area where the smoothing treatment step is conducted, and P2 represents a conveying force applied when the smoothing-treated conductive film is discharged from the area where the smoothing treatment step is conducted.

[2] A method according to according to the present invention, wherein the method satisfies the condition of $$0.58 \leqq R2/R1 \leqq 0.77$$

wherein R1 represents the surface resistance of the conductive film precursor, and R2 represents the surface resistance of the conductive film.

[3] A method according to the present invention, wherein the support has a thickness of 95 to 150 μm.

[4] A method according to the present invention, wherein the photosensitive material has a thickness of 100 to 200 μm.

[5] A method according to the present invention, wherein the conductive film has a length of 2 m or more.

[6] A method according to the present invention, wherein the second calender roll is a metal roll and is brought into contact with the metallic silver portion.

[7] A method according to the present invention, wherein the metal roll has an embossed surface.

[8] A method according to the present invention, wherein the metal roll has a surface roughness of 0.05 to 0.8 s in maximum height Rmax.

[9] A method according to the present invention, wherein the emulsion layer has a silver/binder volume ratio of 1/1 or more.

[10] A method according to the present invention, wherein the smoothing treatment is carried out while applying a load (line pressure) of 200 to 600 kgf/cm (1960 to 5880 N/cm) to the conductive film precursor.

[11] A method according to the present invention, wherein the smoothing treatment is carried out while conveying the conductive film precursor at a conveying rate of 10 to 50 m/minute.

When the conductive film using the photosensitive material having the silver salt-containing emulsion layer (particularly the conductive film using the long support having a thickness of 95 μm or more) is produced by the production method of the present invention, the deformation defect caused due to the wrinkling can be prevented in the smoothing treatment using the calender roll to improve the quality and productivity of the film.

The above and other objects, features and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

The conductive film producing method of the present invention will be described below. The conductive film produced by the method of the present invention can be used in a defroster (defrosting device), a window glass, etc. for a vehicle, and be used as a heating sheet generating heat by flowing an electric current, an electrode for a touch panel, an inorganic EL device, an organic EL device, or a solar cell, or a printed board. It should be noted that, in this description, a numeric range of "A to B" includes both the numeric values A and B as the lower and upper limit values.

<Photosensitive Material for Conductive Film Production>

[Support]

The support of the photosensitive material used in the production method of the present invention may be a plastic film, a plastic plate, a glass plate, etc. Examples of materials for the plastic film and the plastic plate include polyesters such as polyethylene terephthalates (PET) and polyethylene naphthalates; polyolefins such as polyethylenes (PE), polypropylenes (PP), polystyrenes, and EVA; vinyl resins such as polyvinyl chlorides and polyvinylidene chlorides; polyether ether ketones (PEEK); polysulfones (PSF); polyether sulfones (PES); polycarbonates (PC); polyamides; polyimides; acrylic resins; and triacetyl celluloses (TAC).

The thickness of the support is 95 μm or more, and is preferably at most 150 μm. In the method of the present invention, the conductive film containing the long support having a thickness of 95 μm or more can be smoothing-treated using the calender roll while preventing deformation defect caused due to wrinkling. In general, when the support has a thickness of 100 μm or more, the deformation defect is readily caused due to the wrinkling. In the present invention, the deformation defect due to the wrinkling can be sufficiently prevented even under such a condition.

[Silver Salt-containing Layer]

The photosensitive material used in the production method of the present invention has the support and thereon the emulsion layer containing the silver salt (the silver salt-containing layer) as a light sensor. The silver salt-containing layer may contain a binder, a solvent, etc. in addition to the silver salt. Unless some question arises, the emulsion layer containing the silver salt (or the silver salt-containing layer) may be simply referred to as the emulsion layer.

The emulsion layer may be formed by applying an emulsion (a liquid containing a binder, a solvent, etc. in addition to the silver salt) to the support. The emulsion may be temporarily stored in a storage tank, and a required amount of the emulsion may be discharged from the tank and introduced through a liquid delivery device to the application process. The liquid delivery device is preferably a reciprocating pump, and specific examples thereof include plunger pumps and diaphragm pumps.

The difference between the plunger pump and diaphragm pump will be described below.

The plunger pump has a sliding part between a piston and a cylinder. In a case where the emulsion contains a large amount of a binder such as a gelatin, the silver halide is protected by the gelatin and thereby is not affected by the sliding motion of the plunger pump. However, in a case where the emulsion contains a large amount of silver, for example, at a silver/binder volume ratio of 1.5/1 to 4/1, the binder content is small, whereby reduced silver is readily generated due to the pressure sensitivity during the sliding motion. As a result, the reduced silver contaminates the coating layer (the emulsion layer), so that undesirable spots (so-called black pepper) are generated in unexposed areas in the development process.

The diaphragm pump has a similar structure to the plunger pump, and is different in that an elastic flexible membrane (a diaphragm: a membrane composed of a rubber or the like) is used instead of the piston. Even in a case where the emulsion contains a large amount of silver, for example, at a silver/binder volume ratio of 1.5/1 to 4/1, the diaphragm pump can preferably transfer the liquid without the pressure sensitive reduction because of the absence of the sliding part.

Thus, the plunger or diaphragm pump may be used for transferring an emulsion containing a small amount of silver, for example, at a silver/binder volume ratio of 0.25/1 to 1/1, and the diaphragm pump is preferably used for transferring an emulsion containing a large amount of silver, for example, at a silver/binder volume ratio of 1.5/1 to 4/1. A seal composed of a fluorocarbon resin such as a polytetrafluoroethylene is particularly preferably used for pressing the diaphragm. Such a seal is excellent in sealing property, and thereby can prevent leakage of the emulsion to be transferred and incorporation of air, etc.

The emulsion layer may exhibit a swelling ratio of 250% or more. In the present invention, the swelling ratio is defined by the following equation.

$$\text{Swelling ratio}(\%)=100\times((b)-(a))/(a)$$

In the above equation, (a) represents the thickness of the emulsion layer in the dry state, and (b) represents the thickness of the emulsion layer after dipping the layer in distilled water at 25° C. for 1 minute.

For example, the dry emulsion layer thickness of (a) may be measured by observing a cross section of a sample using a scanning electron microscope. The swelled emulsion layer thickness of (b) may be measured by freeze-drying a swelled sample using liquid nitrogen, and then observing a cross section of the sample using a scanning electron microscope.

In the present invention, it is preferred that the emulsion layer of the photosensitive material exhibits the swelling of 250% or more. The preferred swelling ratio range varies depending on the silver/binder volume ratio of the emulsion layer. In the film, the silver halide cannot be swelled, while a binder portion can be swelled. The binder portion exhibits a constant swelling ratio regardless of the silver/binder volume ratio. However, as the silver/binder volume ratio is increased, the swelling ratio of the entire emulsion layer is lowered. In the present invention, the swelling ratio of the emulsion layer is preferably 250% or more when the silver/binder volume ratio of the emulsion layer is 4 or less, the swelling ratio is preferably 200% or more when the silver/binder volume ratio is 4.5 or more but less than 6, and the swelling ratio is preferably 150% or more when the silver/binder volume ratio is 6 or more.

The emulsion layer may contain a dye, a binder, a solvent, etc. if necessary in addition to the silver salt. Each component in the emulsion layer will be described below.

<Dye>

The photosensitive material may contain a dye in at least the emulsion layer. The dye is used in the emulsion layer as a filter dye or for a purpose of irradiation prevention, etc. The dye may be a solid dispersion dye. Preferred examples of the dyes useful in the present invention are described in Japanese Laid-Open Patent Publication No. 2008-251417, and therefore the explanation of the examples is herein omitted. The mass ratio of the dye to the total solid contents in the emulsion layer is preferably 0.01% to 10% by mass, more preferably 0.1% to 5% by mass, in view of effects such as the irradiation prevention effect and sensitivity reduction due to excess addition.

<Silver Salt>

The silver salt used in the present invention may be an inorganic silver salt such as a silver halide or an organic silver salt such as silver acetate. In the present invention, the silver halide is preferred because of its excellent light sensing property.

The silver halide, preferably used in the present invention, will be described below.

In the present invention, the silver halide excellent in the light sensing property is preferred. Silver halide technologies for photographic silver salt films, photographic papers, print engraving films, emulsion masks for photomasking, and the like may be utilized in the present invention.

The silver halide may contain a halogen element of chlorine, bromine, iodine, or fluorine, and may contain a combination of the elements. For example, the silver halide preferably contains AgCl, AgBr, or AgI, more preferably contains AgBr or AgCl, as a main component. The silver halide may contain silver chlorobromide, silver iodochlorobromide, or silver iodobromide. The silver halide is more preferably silver chlorobromide, silver bromide, silver iodochlorobromide, or silver iodobromide, most preferably silver chlorobromide or silver iodochlorobromide having a silver chloride content of 50 mol % or more.

The silver halide is in the state of solid particles. The average particle size of the silver halide particles is preferably 0.1 to 1000 nm (1 μm), more preferably 0.1 to 100 nm, further preferably 1 to 50 nm, in spherical equivalent diameter, in view of the image quality of the patterned metallic silver layer formed after the exposure and development. The spherical equivalent diameter of the silver halide particle means a diameter of a spherical particle having the same volume as the silver halide particle.

The silver halide emulsion, used as a coating liquid for the emulsion layer in the present invention, may be prepared by a method described in P. Glafkides, "Chimie et Physique Photographique", Paul Montel, 1967, G. F. Dufin, "Photographic Emulsion Chemistry", The Forcal Press, 1966, V. L. Zelikman, et al., "Making and Coating Photographic Emulsion", The Forcal Press, 1964, etc.

<Binder>

A binder may be used in the emulsion layer to uniformly disperse the silver salt particles and to help the emulsion layer adhere to the support. In the present invention, though the binder may contain a water-insoluble polymer and a water-soluble polymer, it is preferred that the binder has a high content of a water-soluble component that can be removed by dipping in a hot water or bringing into contact with a water vapor as described hereinafter.

Examples of the binders include gelatins, carrageenans, polyvinyl alcohols (PVA), polyvinyl pyrolidones (PVP), polysaccharides such as starches, celluloses and derivatives thereof, polyethylene oxides, polysaccharides, polyvinylamines, chitosans, polylysines, polyacrylic acids, polyalginic acids, polyhyaluronic acids, and carboxycelluloses. The binders show a neutral, anionic, or cationic property due to ionicity of a functional group.

The binder preferably comprises a gelatin. The gelatin may be a lime-treated gelatin or an acid-treated gelatin, and may be a hydrolyzed gelatin, an enzymatically decomposed gelatin, or a gelatin modified by an amino or carboxyl group (such as a phthalated gelatin or an acetylated gelatin). The gelatin used in the preparation of the silver salt is preferably such that the positive charge of an amino group is converted to the uncharged or negatively charged state. It is further preferable to use the phthalated gelatin additionally.

The amount of the binder in the emulsion layer is not particularly limited, and may be appropriately selected to obtain sufficient dispersion and adhesion properties. The volume ratio of silver/binder in the emulsion layer is preferably 1/2 or more, more preferably 1/1 or more.

<Solvent>

The solvent used for forming the emulsion layer is not particularly limited, and examples thereof include water, organic solvents (e.g. alcohols such as methanol, ketones such as acetone, amides such as formamide, sulfoxides such as dimethyl sulfoxide, esters such as ethyl acetate, ethers), ionic liquids, and mixtures thereof. In the present invention, the mass ratio of the solvent to the total of the silver salt, the binder, and the like in the emulsion layer is 30% to 90% by mass, preferably 50% to 80% by mass.

[Non-photosensitive Intermediate Layer]

The non-photosensitive intermediate layer may contain a gelatin or a combination of a gelatin and an SBR. Further the layer may contain an, additive such as a crosslinking agent or a surfactant.

[Other Layers]

A protective layer may be formed on the emulsion layer. The protective layer used in the present invention comprises a binder such as a gelatin or a macromolecule, and is formed on the photosensitive emulsion layer to improve the scratch prevention or mechanical property. The thickness of the protective layer is preferably 0.3 μm or less. The method of applying or forming the protective layer is not particularly limited, and may be appropriately selected from known coating methods.

<Conductive Film Producing Method>

The method for producing the conductive film using the above photosensitive material will be described below.

In the conductive film producing method of the present invention, first the photosensitive material comprising the support and thereon the silver salt-containing emulsion layer is exposed and developed. Then, the metallic silver portion formed by the development is subjected to the smoothing treatment such as a calender treatment. In the formation of the metallic silver portion, a light-transmitting portion or an insulating portion may be formed in addition to the metallic silver portion, or alternatively the metallic silver portion may be formed on the entire film surface by entire surface exposure. In the conductive film produced by the method of the present invention, the metal portion may be formed on the support by pattern exposure. In the pattern exposure, a scanning exposure method or a surface exposure method may be used. The metallic silver portion may be formed in an exposed area or an unexposed area.

The pattern shape details may be appropriately selected depending on the intended use. For example, the pattern may be a mesh pattern for producing an electromagnetic-shielding film or a wiring pattern for producing a printed board.

The conductive film producing method of the present invention includes the following three embodiments, different in the photosensitive materials and development treatments.

(1) Embodiment comprising subjecting a photosensitive black-and-white silver halide material free of physical development nuclei to a chemical or thermal development, to form the metallic silver portion on the photosensitive material.

(2) Embodiment comprising subjecting a photosensitive black-and-white silver halide material having a silver halide emulsion layer containing a physical development nucleus to a solution physical development, to form the metallic silver portion on the material.

(3) Embodiment comprising subjecting a stack of a photosensitive black-and-white silver halide material free of physical development nuclei and an image-receiving sheet having a non-photosensitive layer containing a physical development nucleus to a diffusion transfer development, to form the metallic silver portion on the non-photosensitive sheet.

A negative development treatment or a reversal development treatment can be used in the embodiments. In the diffusion transfer development, the negative development treatment can be carried out using an auto-positive photosensitive material.

The chemical development, thermal development, solution physical development, and diffusion transfer development have the meanings generally known in the art, and are explained in common photographic chemistry texts such as Shin-ichi Kikuchi, "Shashin Kagaku (Photographic Chemistry)", Kyoritsu Shuppan Co., Ltd. and C. E. K. Mees, "The Theory of Photographic Process, 4th ed."

[Exposure]

In the production method of the present invention, the silver salt-containing layer formed on the support is exposed. The layer may be exposed using an electromagnetic wave. For example, a light (such as a visible light or an ultraviolet light) or a radiation ray (such as an X-ray) may be used to generate the electromagnetic wave. The exposure may be carried out using a light source having a wavelength distribution or a specific wavelength. The irradiation light may be applied in a mesh pattern for producing an electromagnetic-shielding film or in a wiring pattern for producing a printed board.

[Development Treatment]

In the production method of the present invention, the silver salt-containing layer is subjected to a development treatment after the exposure. Common development treatment technologies for photographic silver salt films, photographic papers, print engraving films, emulsion masks for photomasking, and the like may be used in the present invention. A developer for the development treatment is not particularly limited, and may be a PQ developer, an MQ developer, an MAA developer, etc. Examples of commercially available developers usable in the present invention include CN-16, CR-56, CP45X, FD-3, and PAPITOL available from FUJIFILM Corporation; C-41, E-6, RA-4, Dsd-19, and D-72 available from Eastman Kodak Company; and developers contained in kits thereof. The developer may be a lith developer such as D85 available from Eastman Kodak Company.

In the production method of the present invention, by the exposure and development treatments, the metallic silver portion is formed in the exposed area, and the light-transmitting portion to be hereinafter described is formed in the unexposed area. If necessary, the conductivity of the film may be increased by water-washing of the sample to remove a binder, following the development treatment. In the present invention, the development, fixation, and water washing are preferably carried out at 25° C. or lower.

In the production method of the present invention, the development process may contain a fixation treatment for removing the silver salt in the unexposed area to stabilize the material. Common fixation treatment technologies for photographic silver salt films, photographic papers, print engraving films, emulsion masks for photomasking, and the like may be used in the present invention.

The developer for the development treatment may contain an image quality improver for improving the image quality. Examples of the image quality improvers include nitrogen-containing heterocyclic compounds such as benzotriazole. Particularly a polyethylene glycol is preferably used for the lith developer.

The mass ratio of the metallic silver contained in the exposed area after the development to the silver contained in this area before the exposure is preferably 50% or more, more preferably 80% or more by mass. When the mass ratio is 50% by mass or more, a high conductivity can be easily achieved.

After the development treatment, the metallic silver portion in the exposed area contains silver and a non-conductive macromolecule, and the volume ratio of silver/non-conductive macromolecule is preferably 2/1 or more, more preferably 3/1 or more.

In the present invention, a tone (gradation) obtained by the development is preferably more than 4.0, though not particularly restrictive. When the tone after the development is more than 4.0, the conductivity of the conductive metal portion can be increased while maintaining high transparency of the light-transmitting portion. For example, the tone of 4.0 or more can be achieved by doping with rhodium or iridium ion.

[Oxidation Treatment]

In the production method of the present invention, the metallic silver portion formed by the development is preferably subjected to an oxidation treatment. For example, a small amount of a metal deposited on the light-transmitting portion can be removed by the oxidation treatment, so that the transmittance of the light-transmitting portion can be increased to approximately 100%.

For example, the oxidation treatment may be carried out by a known method using an oxidant such as Fe (III) ion. The oxidation treatment may be carried out after the exposure and development treatments of the silver salt-containing layer.

In the present invention, the metallic silver portion may be treated with a Pd-containing solution after the exposure and development treatments. The Pd may be in the state of divalent palladium ion or metal palladium. A black color of the metallic silver portion can be prevented from changing with time owing to this treatment.

In the production method of the present invention, the mesh metallic silver portion having particular line width, opening ratio, and silver content is formed directly on the support by the exposure and development treatments, and thereby can exhibit a satisfactory surface resistivity. Therefore, it is unnecessary to subject the metallic silver portion to further physical development and/or plating to increase the conductivity. Thus, in the present invention, the light-transmitting conductive film can be produced by the simple process.

As described above, the light-transmitting conductive film according to the present invention can be used in a defroster (defrosting device), a window glass, etc. for a vehicle, a heating sheet for heat generation under an electric current, an electrode for a touch panel, an inorganic EL device, an organic EL device, or a solar cell, or a printed board.

[Reduction Treatment]

A desirable film with high conductivity can be obtained by dipping the photosensitive material in an aqueous reducing solution after the development treatment. The aqueous reducing solution may be an aqueous solution of sodium sulfite, hydroquinone, p-phenylenediamine, oxalic acid, etc. The aqueous solution preferably has pH of 10 or more.

[Smoothing Treatment]

In the production method of the present invention, the metallic silver portion (the entire-surface metallic silver portion, patterned metal mesh portion, or patterned metal wiring portion) is subjected to the smoothing treatment after the development. The conductivity of the metallic silver portion can be significantly increased by the smoothing treatment. When the areas of the metallic silver portion and the light-transmitting portion are appropriately designed, the resultant conductive film can have an electrically conductive property suitable for use as a light-transmitting electromagnetic-shielding film having a high electromagnetic-shielding property, a high light transmittability, and a black mesh portion, as a transparent electrode for various electronic devices, or as a transparent planar heating element, etc.

The smoothing treatment may be carried out using a calender roll unit. The calender roll unit generally has a pair of rolls. The smoothing treatment using the calender roll unit is hereinafter referred to as the calender treatment.

The roll used in the calender treatment may be a metal roll or a resin roll such as an epoxy, polyimide, polyamide, or polyimide-amide resin roll. Particularly in a case where the photosensitive material has the emulsion layer only on one side, it is preferred that the calender treatment is carried out under the following conditions to prevent the wrinkling.

(1) The support has a thickness of 95 μm or more in the conductive film precursor, on which the metallic silver portion is formed by subjecting the photosensitive material having the long support and thereon the silver salt-containing emulsion layer to the exposure and development treatments, preferably further to the fixation treatment.
(2) The conductive film precursor is pressed by the first calender roll and the second calender roll facing each other in the calender treatment.
(3) The first calender roll is a resin roll and is brought into contact with the support.
(4) The inequality of $$1/2 \leqq P1/P2 \leqq 1$$

is satisfied, wherein P1 represents a conveying force applied when the conductive film precursor is introduced to an area where the calender treatment step is conducted, and P2 represents a conveying force applied when the calender-treated conductive film is discharged from the area where the calender treatment step is conducted.

When the conductive film using the photosensitive material having the silver salt-containing emulsion layer (particularly the conductive film using the long support having a thickness of 95 μm or more) is produced by performing the smoothing treatment using the calender roll in this manner, the deformation defect caused due to the wrinkling can be prevented in the smoothing treatment to improve the quality and productivity of the film. In addition, the deformation defect due to the wrinkling can be prevented even in a case where the conductive film has a length of 2 m or more.

It is further preferred that the calender treatment is carried out under at least one of the following conditions.

(a) The second calender roll is a metal roll and is brought into contact with the metallic silver portion of the conductive film precursor.
(b) The metal roll has a mirror-finished surface.
(c) The metal roll has an embossed surface.
(d) The embossed metal roll has a surface roughness of 0.05 to 0.8 s in maximum height Rmax.
(e) The emulsion layer of the photosensitive material has a silver/binder volume ratio of 1/1 or more.
(f) The calender treatment of the conductive film precursor is carried out at a load (line pressure) of 200 kgf/cm (1960 N/cm) or more, preferably 200 to 600 kgf/cm (1960 to 5880 N/cm), more preferably 300 to 600 kgf/cm (2940 to 5880 N/cm).
(g) The calender treatment is carried out while conveying the conductive film precursor at a conveying rate of 10 to 50 m/minute.
(h) The inequality of $$0.58 \leqq R2/R1 \leqq 0.77$$

is satisfied, wherein R1 represents the surface resistance of the conductive film precursor, and R2 represents the surface resistance of the conductive film.

The temperature, at which the calender treatment is carried out, is preferably 10° C. (without temperature control) to 100° C. Though the preferred temperature range is different depending on the density and shape of the mesh or wiring metal pattern, the type of the binder, etc., in general the temperature is more preferably 10° C. (without temperature control) to 50° C.

As described above, the high-conductive film having a surface resistance of less than 1.9 (Ω/sq) can be easily produced with low costs by the production method of the present invention.

Thus, in the conductive film producing method of the present invention, by exposing and developing the photosensitive material having the support and the silver salt-containing layer formed thereon, to form the metallic silver portion containing 0.1 to 10 g/m$^2$ of silver, the conductive film having a surface resistance of less than 1.9 can be obtained without forming a further conductive layer on the metallic silver portion.

[Treatment of Dipping in Hot Water or Bringing into Contact with Water Vapor]

In the production method of the present invention, after the conductive metal, portion is formed on the support, zthe resultant may be dipped in a hot water (or a heated water having a higher temperature) or brought into contact with a water vapor. By this treatment, the conductivity and the transparency can be easily improved in a short time. It is considered that the water-soluble binder is partly removed, whereby bindings between the metals (the conductive substances) are increased. This treatment is desirably carried out after the smoothing treatment though may be carried out after the development treatment.

The temperature of the hot water (or the heated water having a higher temperature), in which the support is dipped, is preferably 60° C. to 100° C., more preferably 80° C. to 100° C. The temperature of the water vapor, with which the support is brought into contact, is preferably 100° C. to 140° C. at 1 atm. The time of the treatment of dipping in the hot water (or the heated water having a higher temperature) or being in contact with the water vapor depends on the type of the water-soluble binder used. When the support has a size of 60 cm×1 m, the treatment time is preferably about 10 seconds to 5 minutes, more preferably about 1 to 5 minutes.

[Plating Treatment]

In the present invention, the metallic silver portion is subjected to the smoothing treatment, and may be subjected to a plating treatment. By the plating treatment, the surface resistance can be further reduced, and the conductivity can be further increased. The smoothing treatment may be carried out before or after the plating treatment. When the smoothing treatment is carried out before the plating treatment, the plating treatment can be more efficiently carried out to form a uniform plated layer. The plating treatment may be an electrolytic or electroless plating treatment. The material for the plated layer is preferably a metal with a sufficient conductivity such as copper.

The present invention may be appropriately combined with technologies described in the following Laid-Open Patent Publications and International Pamphlets shown in Tables 1 and 2. "Japanese Laid-Open Patent", "Publication No.", "Pamphlet No.", and the like are omitted.

TABLE 1

| | | | | |
|---|---|---|---|---|
| 2004-221564 | 2004-221565 | 2007-200922 | 2006-352073 | 2007-129205 |
| 2007-235115 | 2007-207987 | 2006-012935 | 2006-010795 | 2006-228469 |
| 2006-332459 | 2009-21153 | 2007-226215 | 2006-261315 | 2007-072171 |
| 2007-102200 | 2006-228473 | 2006-269795 | 2006-269795 | 2006-324203 |
| 2006-228478 | 2006-228836 | 2007-009326 | 2006-336090 | 2006-336099 |
| 2006-348351 | 2007-270321 | 2007-270322 | 2007-201378 | 2007-335729 |
| 2007-134439 | 2007-149760 | 2007-208133 | 2007-178915 | 2007-334325 |
| 2007-310091 | 2007-116137 | 2007-088219 | 2007-207883 | 2007-013130 |
| 2005-302508 | 2008-218784 | 2008-227350 | 2008-227351 | 2008-244067 |
| 2008-267814 | 2008-270405 | 2008-277675 | 2008-277676 | 2008-282840 |
| 2008-283029 | 2008-288305 | 2008-288419 | 2008-300720 | 2008-300721 |
| 2009-4213 | 2009-10001 | 2009-16526 | 2009-21334 | 2009-26933 |
| 2008-147507 | 2008-159770 | 2008-159771 | 2008-171568 | 2008-198388 |
| 2008-218096 | 2008-218264 | 2008-224916 | 2008-235224 | 2008-235467 |
| 2008-241987 | 2008-251274 | 2008-251275 | 2008-252046 | 2008-277428 |

TABLE 2

| | | | | |
|---|---|---|---|---|
| 2006/001461 | 2006/088059 | 2006/098333 | 2006/098336 | 2006/098338 |
| 2006/098335 | 2006/098334 | 2007/001008 | | |

EXAMPLES

The present invention will be described more specifically below with reference to Examples. Materials, amounts, ratios, treatment contents, treatment procedures, and the like, used in Examples, may be appropriately changed without departing from the scope of the present invention. The following specific examples are, therefore, to be considered in all respects as illustrative and not restrictive.

First Example

Examples 1 to 6 and Comparative Examples 1 to 7

[Preparation of Emulsion]

| Liquid 1 | |
|---|---|
| Water | 750 ml |
| Phthalated gelatin | 20 g |

-continued

| | |
|---|---|
| Sodium chloride | 3 g |
| 1,3-Dimethylimidazolidine-2-thione | 20 mg |
| Sodium benzenethiosulfonate | 10 mg |
| Citric acid | 0.7 g |
| **Liquid 2** | |
| Water | 300 ml |
| Silver nitrate | 150 g |
| **Liquid 3** | |
| Water | 300 ml |
| Sodium chloride | 38 g |
| Potassium bromide | 32 g |
| Potassium hexachloroiridate (III) (0.005% KCl, 20% aqueous solution) | 5 ml |
| Ammonium hexachlororhodate (0.001% NaCl, 20% aqueous solution) | 7 ml |

The potassium hexachloroiridate (III) (0.005% KCl, 20% aqueous solution) and the ammonium hexachlororhodate (0.001% NaCl, 20% aqueous solution) in Liquid 3 were prepared by dissolving a complex powder in a 20% aqueous solution of KCl or NaCl, and by heating the resultant solution at 40° C. for 120 minutes, respectively.

Liquid 1 was maintained at 38° C. and pH 4.5, and Liquids 2 and 3 were simultaneously added to Liquid 1 over 20 minutes under stirring in an amount of 90% of the total, to form 0.16-μm nuclear particles. Subsequently, Liquids 4 and 5 described below were added thereto over 8 minutes, and residual 10% of Liquids 2 and 3 were added over 2 minutes, so that the nuclear particles were grown to 0.21 μM. Further, 0.15 g of potassium iodide was added, and the resulting mixture was ripened for 5 minutes, whereby the particle formation was completed.

| Liquid 4 | |
|---|---|
| Water | 100 ml |
| Silver nitrate | 50 g |
| **Liquid 5** | |
| Water | 100 ml |
| Sodium chloride | 13 g |
| Potassium bromide | 11 g |
| Yellow prussiate of potash | 5 mg |

The particles were water-washed by a common flocculation method. Specifically, the temperature was lowered to 35° C., the pH was lowered by sulfuric acid until the silver halide was precipitated (within a pH range of 3.6 ±0.2), and about 3 L of the supernatant solution was removed (first water washing). Further, 3 L of a distilled water was added thereto, sulfuric acid was added until the silver halide was precipitated, and 3 L of the supernatant solution was removed again (second water washing). The procedure of the second water washing was repeated once more (third water washing), whereby the water washing and demineralization process was completed. After the water washing and demineralization process, the obtained emulsion was controlled at pH of 6.4 and a pAg of 7.5. 100 mg of a stabilizer of 1,3,3a,7-tetraazaindene and 100 mg of an antiseptic agent of PROXEL (trade name, available from ICI Co., Ltd.) were added thereto, to obtain a final emulsion of cubic silver iodochlorobromide particles, which contained 70 mol % of silver chloride and 0.08 mol % of silver iodide, and had an average particle diameter of 0.22 μm and a variation coefficient of 9%. The final emulsion had pH of 6.4, pAg of 7.5, a conductivity of 4000 μS/cm, a density of $1.4\times10^3$ kg/$m^3$, and a viscosity of 20 mPa·s.

[Production of Coating Sample]

$8.0\times10^{-4}$ mol/mol Ag of the following compound (Cpd-1) and $1.2\times10^{-4}$ mol/mol Ag of 1,3,3a,7-tetraazaindene were added to the emulsion, and the resultant was well mixed. Then, the following compound (Cpd-2) was added to the mixture to control the swelling ratio if necessary, and the pH of the coating liquid was controlled to 5.6 using citric acid.

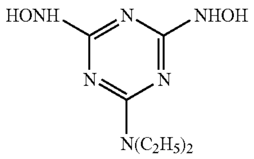

Cpd-1

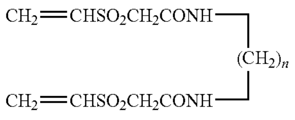

Cpd-2

(n = 2): (n = 3) = 3:1

An undercoat layer was formed on a 100-μm-thick polyethylene terephthalate (PET), and the emulsion layer coating liquid prepared from the above emulsion was applied to the undercoat layer at an Ag density of 5 $g/m^2$ and a gelatin density of 0.4 $g/m^2$. The resultant was dried to obtain a coating sample.

In the obtained coating sample, the emulsion layer had a silver/binder volume ratio (silver/GEL ratio (vol)) of 1/1. Thus, the emulsion layer satisfied the silver/binder volume ratio condition of 1/1 or more, preferably used in the photosensitive material for forming the conductive film according to the present invention.

[Exposure and Development]

The dried coating was exposed to a parallel light from a light source of a high-pressure mercury lamp, through a photomask having a lattice-patterned space (line/space=195 μm/5 μm (pitch 200 μm)). The photomask was capable of forming a patterned developed silver image (line/space=μm/195 μm). Then, the coating was subjected to a treatment containing development, fixation, water washing, and drying.

(Developer Composition)

1 L of the developer contained the following compounds.

| | |
|---|---|
| Hydroquinone | 15 g/L |
| Sodium sulfite | 30 g/L |
| Potassium carbonate | 40 g/L |
| Ethylenediamine tetraacetate | 2 g/L |
| Potassium bromide | 3 g/L |
| Polyethylene glycol 2000 | 1 g/L |
| Potassium hydroxide | 4 g/L |
| pH | Controlled at 10.5 |

(Fixer Composition)

1 L of the fixer contained the following compounds.

| | |
|---|---|
| Ammonium thiosulfate (75%) | 300 ml |
| Ammonium sulfite monohydrate | 25 g/L |
| 1,3-Diaminopropane tetraacetate | 8 g/L |
| Acetic acid | 5 g/L |
| Aqueous ammonia (27%) | 1 g/L |
| Potassium iodide | 2 g/L |
| pH | Controlled at 6.2 |

[Reduction Treatment]

The above developed sample was dipped in a 10 wt % aqueous sodium sulfite solution kept at 40° C. for 10 minutes.

[Calender Treatment]

The above developed sample (the conductive film precursor) was subjected to a calender treatment under the following conditions shown in Table 3.

TABLE 3

| | Composition of rolls | Undercoat layer | Support thickness (μm) | Introduction conveying force P1 (kg/width) | Discharge conveying force P2 (kg/width) | Load (kgf/cm) | Conveying rate (m/minute) | Wrinkling |
|---|---|---|---|---|---|---|---|---|
| Example 1 | Metal-Resin | Formed | 100 | 20 | 20 | 200 | 10 | Not caused |
| Example 2 | Metal-Resin | Formed | 100 | 20 | 20 | 400 | 10 | Not caused |
| Example 3 | Metal-Resin | Formed | 100 | 15 | 20 | 400 | 10 | Not caused |
| Example 4 | Metal-Resin | Formed | 100 | 10 | 20 | 400 | 10 | Not caused |
| Example 5 | Metal-Resin | Formed | 100 | 10 | 20 | 400 | 50 | Not caused |
| Example 6 | Metal-Resin | Formed | 100 | 20 | 20 | 400 | 50 | Not caused |
| Comparative Example 1 | Metal-Metal | Formed | 100 | 40 | 20 | 300 | 10 | Caused |
| Comparative Example 2 | Metal-Metal | Formed | 100 | 45 | 20 | 300 | 10 | Caused |
| Comparative Example 3 | Metal-Metal | Formed | 100 | 45 | 20 | 200 | 10 | Caused |
| Comparative Example 4 | Metal-Metal | Formed | 100 | 45 | 20 | 200 | 50 | Caused |
| Comparative Example 5 | Metal-Metal | Formed | 100 | 40 | 20 | 400 | 50 | Caused |

TABLE 3-continued

| | Composition of rolls | Undercoat layer | Support thickness (μm) | Introduction conveying force P1 (kg/width) | Discharge conveying force P2 (kg/width) | Load (kgf/cm) | Conveying rate (m/minute) | Wrinkling |
|---|---|---|---|---|---|---|---|---|
| Comparative Example 6 | Metal-Metal | Formed | 100 | 30 | 20 | 400 | 50 | Caused |
| Comparative Example 7 | Metal-Metal | Formed | 100 | 20 | 20 | 400 | 50 | Caused |

Example 1

A metal roll (which had an iron core plated with a hard chrome, a mirror-finished surface, and a roll diameter of 250 mm) was used as a calender roll to be in contact with the metallic silver portion, and a resin roll (which had an iron core coated with an epoxy resin, and a roll diameter of 250 mm) was used as a calender roll to be in contact with the support. The sample was transferred between the metal roll and the resin roll, whereby the sample was calender-treated at a load of 200 kgf/cm (1960 N/cm) to obtain a conductive film of Example 1. In this process, the introduction conveying force P1 (the conveying force applied when the sample was introduced to the area where the calender treatment step was conducted) was 20 (kg/width), and the discharge conveying force P2 (the conveying force applied when the calender-treated sample was discharged from the area where the calender treatment step was conducted) was 20 (kg/width), so that P1/P2 was 1. The sample was transferred at a conveying rate of 10 m/minute.

Example 2

A conductive film of Example 2 was produced in the same manner as Example 1 except that the calender treatment was carried out under a load of 400 kgf/cm (3920 N/cm).

Example 3

A conductive film of Example 3 was produced in the same manner as Example 1 except that the calender treatment was carried out under an introduction conveying force P1 of 15 (kg/width) and a load of 400 kgf/cm (3920 N/cm).

Example 4

A conductive film of Example 4 was produced in the same manner as Example 1 except that the calender treatment was carried out under an introduction conveying force P1 of 10 (kg/width) and a load of 400 kgf/cm (3920 N/cm).

Example 5

A conductive film of Example 5 was produced in the same manner as Example 1 except that the calender treatment was carried out under an introduction conveying force P1 of 10 (kg/width), a load of 400 kgf/cm (3920 N/cm), and a conveying rate of 50 m/minute.

Example 6

A conductive film of Example 6 was produced in the same manner as Example 1 except that the calender treatment was carried out under a load of 400 kgf/cm (3920 N/cm) and a conveying rate of 50 m/minute.

Comparative Example 1

A pair of metal rolls (which had an iron core plated with a hard chrome, a mirror-finished surface, and a roll diameter of 250 mm) were used as calender rolls. The sample was transferred between the metal rolls, whereby the sample was calender-treated at a load of 300 kgf/cm (2940 N/cm) to obtain a conductive film of Comparative Example 1. In this process, the introduction conveying force P1 was 40 (kg/width), and the discharge conveying force P2 was 20 (kg/width), so that P1/P2 was 2. The sample was transferred at a conveying rate of 10 m/minute.

Comparative Example 2

A conductive film of Comparative Example 2 was produced in the same manner as Comparative Example 1 except that the calender treatment was carried out under an introduction conveying force P1 of 45 (kg/width).

Comparative Example 3

A conductive film of Comparative Example 3 was produced in the same manner as Comparative Example 1 except that the calender treatment was carried out under an introduction conveying force P1 of 45 (kg/width) and a load of 200 kgf/cm (1960 N/cm).

Comparative Example 4

A conductive film of Comparative Example 4 was produced in the same manner as Comparative Example 1 except that the calender treatment was carried out under an introduction conveying force P1 of 45 (kg/width), a load of 200 kgf/cm (1960 N/cm), and a conveying rate of 50 m/minute.

Comparative Example 5

A conductive film of Comparative Example 5 was produced in the same manner as Comparative Example 1 except that the calender treatment was carried out under a load of 400 kgf/cm (3920 N/cm) and a conveying rate of 50 m/minute.

Comparative Example 6

A conductive film of Comparative Example 6 was produced in the same manner as Comparative Example 1 except that the calender treatment was carried out under an introduction conveying force P1 of 30 (kg/width), a load of 400 kgf/cm (3920 N/cm), and a conveying rate of 50 m/minute.

Comparative Example 7

A conductive film of Comparative Example 7 was produced in the same manner as Comparative Example 1 except that the calender treatment was carried out under an introduction conveying force P1 of 20 (kg/width), a load of 400 kgf/cm (3920 N/cm), and a conveying rate of 50 m/minute.

[Evaluation]

Incidence of wrinkling in the calender-treated films of Examples 1 to 6 and Comparative Examples 1 to 7 were visually observed and evaluated. The evaluation results are shown in Table 3. As shown in Table 3, in Examples 1 to 6, the metal roll faced the metallic silver portion, the resin roll faced the support, and the ratio of the introduction conveying force P1 to the discharge conveying force P2 (P1/P2) satisfied the condition of $1/2 \leqq P1/P2 \leqq 1$, whereby the wrinkling was not found. In contrast, in Comparative Example 1 to 7, each sample was calender-treated using the pair of metal rolls, and the ratio of the introduction conveying force P1 to the discharge conveying force P2 (P1/P2) did not satisfy the condition of $1/2 \leqq P1/P2 \leqq 1$, whereby the wrinkling was observed.

Second Example

A mirror-finished metal roll was used in Examples 11 to 15, an embossed metal roll was used in Examples 16 to 20, and the surface resistance decrease rates were measured under various loads to evaluate the difference between the metal rolls. The emulsion preparation, the coating sample production, the exposure and development treatments, and the reduction treatment were carried out in the same manner as Example 1.

[Measurement of Surface Resistance]

The surface resistance of each sample according to Examples 11 to 20 was measured before the calender treatment (after the fixation) and after the calender treatment. The surface resistances of 10 areas optionally selected in each sample were measured by LORESTA GP (Model No. MCP-T610) manufactured by Dia Instruments Co., Ltd. utilizing an in-line four-probe method (ASP), and the average of the measured values was used for the surface resistance evaluation. The measurement results of Examples 11 to 20 are shown in Table 4 with details.

TABLE 4

| | | Surface resistance (Ω/sq) | | |
|---|---|---|---|---|
| | Roll structure | Before calender treatment | After calender treatment | Decrease rate |
| Example 11 | Metal (mirror)-Resin | 1.845 | 1.246 | 0.68 |
| Example 12 | Metal (mirror)-Resin | 1.410 | 0.862 | 0.61 |
| Example 13 | Metal (mirror)-Resin | 1.533 | 0.914 | 0.60 |
| Example 14 | Metal (mirror)-Resin | 1.800 | 1.140 | 0.63 |
| Example 15 | Metal (mirror)-Resin | 1.771 | 1.025 | 0.58 |
| Example 16 | Metal (emboss)-Resin | 1.740 | 1.336 | 0.77 |
| Example 17 | Metal (emboss)-Resin | 1.716 | 1.162 | 0.68 |
| Example 18 | Metal (emboss)-Resin | 1.642 | 1.266 | 0.77 |

TABLE 4-continued

| | | Surface resistance (Ω/sq) | | |
|---|---|---|---|---|
| | Roll structure | Before calender treatment | After calender treatment | Decrease rate |
| Example 19 | Metal (emboss)-Resin | 1.804 | 1.192 | 0.66 |
| Example 20 | Metal (emboss)-Resin | 1.743 | 1.212 | 0.70 |

Calender-treated conductive films were produced in the same manner as Example 1 except that the support had a thickness of 90, 120, or 150 μm. Also, the conductive films had no wrinkling. In general, when the support has a large thickness, the wrinkling is readily caused. In the present invention, the wrinkling can be prevented by controlling the conveying force.

Example 11

A metal roll (which had an iron core plated with a hard chrome, a mirror-finished surface, and a roll diameter of 250 mm) was used as a calender roll to be in contact with the metallic silver portion, and a resin roll (which had an iron core coated with an epoxy resin, and a roll diameter of 250 mm) was used as a calender roll to be in contact with the support. The sample was transferred between the metal roll and the resin roll, whereby the sample was calender-treated at a load of 200 kgf/cm (1960 N/cm) to obtain a conductive film of Example 11. In this process, the introduction conveying force P1 was 20 (kg/width), and the discharge conveying force P2 was 20 (kg/width), so that P1/P2 was 1. The sample was transferred at a conveying rate of 10 m/minute. The sample had a surface resistance of 1.845 (Ω/sq) before the calender treatment (after the fixation) and had a surface resistance of 1.246 (Ω/sq) after the calender treatment, so that the decrease rate was 1.246/1.845=0.68 (i.e. decreased by 32%).

Example 12

A conductive film of Example 12 was produced in the same manner as Example 11 except that the calender treatment was carried out under a load of 300 kgf/cm (2940 N/cm). In this case, the decrease rate was 0.862/1.41=0.61 (i.e. decreased by 39%).

Example 13

A conductive film of Example 13 was produced in the same manner as Example 11 except that the calender treatment was carried out under a load of 400 kgf/cm (3920 N/cm). In this case, the decrease rate was 0.914/1.533=0.60 (i.e. decreased by 40%).

Example 14

A conductive film of Example 14 was produced in the same manner as Example 11 except that the calender treatment was carried out under a load of 500 kgf/cm (4900 N/cm). In this case, the decrease rate was 1.14/1.8=0.63 (i.e. decreased by 37%).

Example 15

A conductive film of Example 15 was produced in the same manner as Example 11 except that the calender treatment was carried out under a load of 600 kgf/cm (5880 N/cm). In this case, the decrease rate was 1.025/1.771=0.58 (i.e. decreased by 42%).

Example 16

A conductive film of Example 16 was produced in the same manner as Example 11 except that a metal roll (which had an iron core plated with a hard chrome, an embossed surface, a surface roughness Rmax of 0.05 to 0.8 s, and a roll diameter of 250 mm) was used as the calender roll brought into contact with the metallic silver portion, and a resin roll (which had an iron core coated with an epoxy resin, and a roll diameter of 250 mm) was used as the calender roll brought into contact with the support. In this case, the decrease rate was 1.336/1.74=0.77 (i.e. decreased by 23%).

Example 17

A conductive film of Example 17 was produced in the same manner as Example 16 except that the calender treatment was carried out under a load of 300 kgf/cm (2940 N/cm). In this case, the decrease rate was 1.162/1.716=0.68 (i.e. decreased by 32%).

Example 18

A conductive film of Example 18 was produced in the same manner as Example 16 except that the calender treatment was carried out under a load of 400 kgf/cm (3920 N/cm). In this case, the decrease rate was 1.266/1.642=0.77 (i.e. decreased by 23%).

Example 19

A conductive film of Example 19 was produced in the same manner as Example 16 except that the calender treatment was carried out under a load of 500 kgf/cm (4900 N/cm). In this case, the decrease rate was 1.192/1.804=0.66 (i.e. decreased by 34%).

Example 20

A conductive film of Example 20 was produced in the same manner as Example 16 except that the calender treatment was carried out under a load of 600 kgf/cm (5880 N/cm). In this case, the decrease rate was 1.212/1.743=0.70 (i.e. decreased by 30%).

[Evaluation]

As shown in Table 4, Examples 11 to 20 satisfied the condition of $0.58 \leqq R2/R1 \leqq 0.77$ (in which R1 represents the surface resistance of the conductive film precursor, and R2 represents the surface resistance of the conductive film), and thus the surface resistance was efficiently reduced in these cases. The films of Examples 16 to 20 using the embossed metal roll exhibited the decrease rates lower than those of the films of Examples 11 to 15 using the mirror-finished metal roll. This is attributed to the fact that each sample was not uniformly pressed by the combination of the rough embossed surface and the resin surface, and that the silver density of the metallic silver portion fails to be increased.

Third Example

As a liquid delivery device for transferring the prepared emulsion, a plunger pump was used in Reference Examples 1 to 6, and a diaphragm pump was used in Examples 21 to 26. The number of black spots (black peppers) generated per unit area of each film [number/$mm^2$] was visually counted using a microscope. The results are shown in Table 5.

TABLE 5

| | Silver/binder volume ratio | Liquid delivery device | Number of black spot (per 1 $mm^2$) |
|---|---|---|---|
| Example 21 | 0.25/1 | Diaphragm pump | 0 |
| Example 22 | 0.5/1 | Diaphragm pump | 0 |
| Example 23 | 1/1 | Diaphragm pump | 0 |
| Example 24 | 1.5/1 | Diaphragm pump | 0 |
| Example 25 | 2/1 | Diaphragm pump | 0 |
| Example 26 | 4/1 | Diaphragm pump | 0 |
| Reference Example 1 | 0.25/1 | Plunger pump | 0 |
| Reference Example 2 | 0.5/1 | Plunger pump | 0 |
| Reference Example 3 | 1/1 | Plunger pump | 5 |
| Reference Example 4 | 1.5/1 | Plunger pump | 12 |
| Reference Example 5 | 2/1 | Plunger pump | 20 |
| Reference Example 6 | 4/1 | Plunger pump | 100 |

Reference Example 1 and Example 21

Each conductive film was produced in the same manner as Example 1 except that the emulsion had a silver/binder volume ratio of 0.25/1.

Reference Example 2 and Example 22

Each conductive film was produced in the same manner as Example 1 except that the emulsion had a silver/binder volume ratio of 0.5/1.

Reference Example 3 and Example 23

Each conductive film was produced in the same manner as Example 1, the emulsion having a silver/binder volume ratio of 1/1.

Reference Example 4 and Example 24

Each conductive film was produced in the same manner as Example 1 except that the emulsion had a silver/binder volume ratio of 1.5/1.

Reference Example 5 and Example 25

Each conductive film was produced in the same manner as Example 1 except that the emulsion had a silver/binder volume ratio of 2/1.

Reference Example 6 and Example 26

Each conductive film was produced in the same manner as Example 1 except that the emulsion had a silver/binder volume ratio of 4/1.

[Evaluation]

As shown in Table 5, among Reference Examples 1 to 6 using the plunger pump, black spots were generated in Reference Examples 3 to 6 using the emulsions having silver/binder volume ratios of 1/1 or more. Particularly, as the silver/ binder volume ratio of the emulsion was increased, the number of black spots was increased in an exponential manner.

In contrast, in Examples 21 to 26 using the diaphragm pump, black spots were not generated within the measurement range (i.e. the silver/binder volume ratio range of 0.25/1 to 4/1).

It is clear from the results that the diaphragm pump is preferred for transferring an emulsion having a high silver content such as a silver/binder volume ratio of 1.5/1 to 4/1.

It should be understood that the conductive film producing method of the present invention is not limited to the above embodiments, and various changes and modifications may be made therein without departing from the scope of the present invention.

What is claimed is:

1. A method for producing a conductive film, comprising a metallic silver forming step of exposing and developing a photosensitive material comprising a long support and thereon an emulsion layer containing a silver salt, thereby forming a metallic silver portion to prepare a conductive film precursor, and a smoothing treatment step of subjecting the conductive film precursor to a smoothing treatment to produce a conductive film, wherein the support has a thickness of 95 μm or more, the conductive film precursor is pressed by a first calender roll and a second calender roll facing each other in the smoothing treatment, the first calender roll is a resin roll and is brought into contact with the support, and the method satisfies the condition of $$1/2 \leqq P1/P2 \leqq 1$$

wherein P1 represents a conveying force applied when the conductive film precursor is introduced to an area where the smoothing treatment step is conducted, and P2 represents a conveying force applied when the smoothing-treated conductive film is discharged from the area where the smoothing treatment step is conducted.

2. A method according to claim 1, wherein the method satisfies the condition of $$0.58 \leqq R2/R1 \leqq 0.77$$

wherein R1 represents the surface resistance of the conductive film precursor, and R2 represents the surface resistance of the conductive film.

3. A method according to claim 1, wherein the support has a thickness of 95 μm or more and 150 μm or less.

4. A method according to claim 1, wherein the photosensitive material has a thickness of 100 μm or more and 200 μm or less.

5. A method according to claim 1, wherein the conductive film has a length of 2 m or more.

6. A method according to claim 1, wherein the second calender roll is a metal roll and is brought into contact with the metallic silver portion.

7. A method according to claim 6, wherein the metal roll has an embossed surface.

8. A method according to claim 6, wherein the metal roll has a surface roughness of 0.05 to 0.8 s in maximum height Rmax.

9. A method according to claim 1, wherein the emulsion layer has a silver/binder volume ratio of 1/1 or more.

10. A method according to claim 1, wherein the smoothing treatment is carried out while applying a load (line pressure) of 200 to 600 kgf/cm (1960 to 5880 N/cm) to the conductive film precursor.

11. A method according to claim 1, wherein the smoothing treatment is carried out while conveying the conductive film precursor at a conveying rate of 10 to 50 m/minute.

* * * * *